US012652765B2

(12) United States Patent
Sadakuni

(10) Patent No.: US 12,652,765 B2
(45) Date of Patent: Jun. 9, 2026

(54) POWER CONVERTER

(71) Applicant: Mitsubishi Electric Corporation,
Tokyo (JP)

(72) Inventor: Hitoshi Sadakuni, Tokyo (JP)

(73) Assignee: Mitsubishi Electric Corporation,
Tokyo (JP)

( * ) Notice: Subject to any disclaimer, the term of this
patent is extended or adjusted under 35
U.S.C. 154(b) by 293 days.

(21) Appl. No.: 18/558,249

(22) PCT Filed: May 24, 2021

(86) PCT No.: PCT/JP2021/019642
§ 371 (c)(1),
(2) Date: Oct. 31, 2023

(87) PCT Pub. No.: WO2022/249248
PCT Pub. Date: Dec. 1, 2022

(65) Prior Publication Data
US 2024/0373568 A1 Nov. 7, 2024

(51) Int. Cl.
*H05K 5/02* (2006.01)
*H02M 7/00* (2006.01)
*H02M 7/48* (2007.01)
(52) U.S. Cl.
CPC .......... *H05K 5/0217* (2013.01); *H02M 7/003*
(2013.01); *H02M 7/48* (2013.01)
(58) Field of Classification Search
CPC . H05K 5/0217; H05K 7/14339; H02M 7/003;
H02M 7/48; H02M 7/4835
See application file for complete search history.

(56) References Cited

U.S. PATENT DOCUMENTS 5,883,431 A * 3/1999 Dubelloy .............. H01L 25/117
257/726
9,839,146 B2 * 12/2017 Cole ...................... H10D 30/60
(Continued)

FOREIGN PATENT DOCUMENTS

CN 209199697 U * 8/2019
CN 110957930 A 4/2020
(Continued)

OTHER PUBLICATIONS

Machine translation of CN110957930 (Year: 2025).*
(Continued)

*Primary Examiner* — Sagar Shrestha
(74) *Attorney, Agent, or Firm* — Buchanan Ingersoll &
Rooney PC

(57) ABSTRACT

A power converter according to an embodiment includes a
plurality of first insulators, a first metal base disposed on the
plurality of first insulators, at least one insulating frame
disposed on the first metal base, and a plurality of submod-
ules installed on the at least one insulating frame. Each of the
at least one insulating frame includes a plurality of support
columns and a plurality of insulating plates which are
supported by the plurality of support columns and on which
the plurality of submodules are disposed. Each of the
plurality of support columns includes a plurality of metal
columns and a plurality of second insulators, and is disposed
on the first metal base with one of the plurality of second
insulators interposed therebetween. Two adjacent metal col-
umns among the plurality of metal columns are connected to
each other by a corresponding one of the plurality of second
insulators.

10 Claims, 15 Drawing Sheets

(56)                    References Cited

U.S. PATENT DOCUMENTS

| | | | | |
|---|---|---|---|---|
| 11,159,092 B2 * | 10/2021 | Takahashi | ............. | H02M 7/483 |
| 11,800,672 B2 * | 10/2023 | Kim | ......................... | H01C 1/01 |
| 12,003,187 B2 * | 6/2024 | Nakabayashi | ....... | H05K 7/1432 |
| 2018/0041135 A1 * | 2/2018 | Onishi | ................ | H02M 7/2176 |
| 2018/0375424 A1 * | 12/2018 | Kim | ...................... | H01R 11/14 |
| 2020/0113093 A1 * | 4/2020 | Nakabayashi | ..... | H05K 7/14339 |
| 2021/0273576 A1 * | 9/2021 | Nakabayashi | ........ | H02M 7/003 |
| 2023/0378885 A1 * | 11/2023 | Sasahara | ................. | H05K 9/00 |

FOREIGN PATENT DOCUMENTS

| | | | |
|---|---|---|---|
| JP | S63117658 A | 5/1988 |
| JP | H07131980 A | 5/1995 |
| JP | H0837280 A | 2/1996 |
| WO | 2019003432 A1 | 1/2019 |

OTHER PUBLICATIONS

Machine translation of CN209199697 (Year: 2025).*
Extended European Search Report dated Jun. 25, 2024, issued in the corresponding European Patent Application No. 21942905.7, 13 pages.
International Search Report (PCT/ISA/210) with translation and Written Opinion (PCT/ISA/237) mailed on Aug. 17, 2021, by the Japan Patent Office as the International Searching Authority for International Application No. PCT/JP2021/019642. (8 pages).

* cited by examiner

POWER CONVERTER

TECHNICAL FIELD

The present disclosure relates to a power converter.

BACKGROUND ART

WO 2019/003432 (PTL 1) describes a power converter. The power converter described in PTL 1 includes a plurality of base columns, a first stage, a plurality of stage columns, a second stage, and a plurality of power conversion units.

The first stage is supported by the plurality of base columns. The second stage is supported by the plurality of base columns. Each of the plurality of stage columns is attached to each of the plurality of base columns. The plurality of power conversion units are disposed on the first stage and the second stage.

CITATION LIST

Patent Literature

PTL 1: WO 2019/003432

SUMMARY OF INVENTION

Technical Problem

In the power converter described in PTL 1, since each of the plurality of stage columns is attached to each of the plurality of base columns, the number and the arrangement of the plurality of base columns are restricted by the number and the arrangement of the plurality of stage columns.

An object of the present disclosure is to provide a power converter in which the number and the arrangement of insulators for supporting an insulating frame are not restricted by support columns of the insulating frame.

Solution to Problem

The power converter according to an embodiment of the present disclosure includes a plurality of first insulators, a first metal base disposed on the plurality of first insulators, at least one insulating frame disposed on the first metal base, and a plurality of submodules installed on the at least one insulating frame. Each of the at least one insulating frame includes a plurality of support columns and a plurality of insulating plates which are supported by the plurality of support columns and on which the plurality of submodules are disposed. Each of the plurality of support columns includes a plurality of metal columns and a plurality of second insulators, and being disposed on the first metal base with one of the plurality of second insulators interposed therebetween. Two adjacent metal columns among the plurality of metal columns are connected to each other by a corresponding one of the plurality of second insulators.

Advantageous Effects of Invention

According to the power converter of the present disclosure, the number and the arrangement of insulators for supporting the insulating frame can be prevented from being restricted by the support columns of the insulating frame.

DESCRIPTION OF EMBODIMENTS

Figure 1:
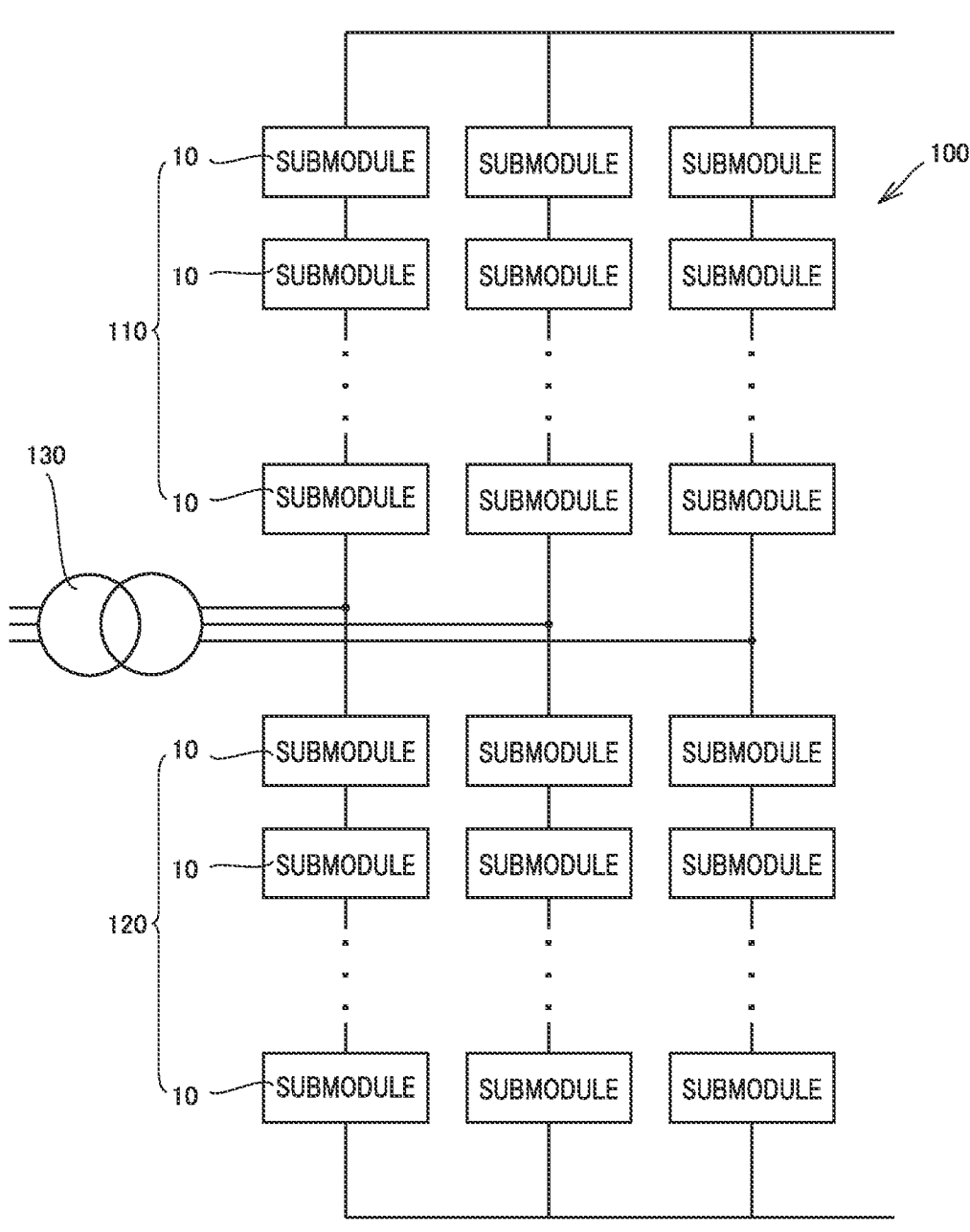
FIG. 1 is a schematic circuit diagram of a power converter 100.

Embodiments of the present disclosure will be described in detail with reference to the drawings. In the present disclosure, the same or corresponding parts will be denoted by the same reference numerals, and the description thereof will not be repeated.

First Embodiment

A power converter according to a first embodiment (hereinafter referred to as "power converter 100") will be described.

Configuration of Power Converter 100

Hereinafter, the configuration of the power converter 100 will be described.

The power converter 100 is, for example, an MMC (Multilevel Modular Converter) type HVDC (High Voltage DC) converter. However, the power converter 100 is not limited thereto. FIG. 1 is a schematic circuit diagram of the power converter 100. As illustrated in FIG. 1, the power converter 100 includes multiple pairs of an upper arm 110 and a lower arm 120. The upper arm 110 and the lower arm 120 are connected to each other in series. The pairs of the upper arm 110 and the lower arm 120 are connected to each other in parallel. A transformer 130 is connected between the upper arm 110 and the lower arm 120. The upper arm 110 and the lower arm 120 each include a plurality of submodules 10 connected to each other in series.

Figure 2:
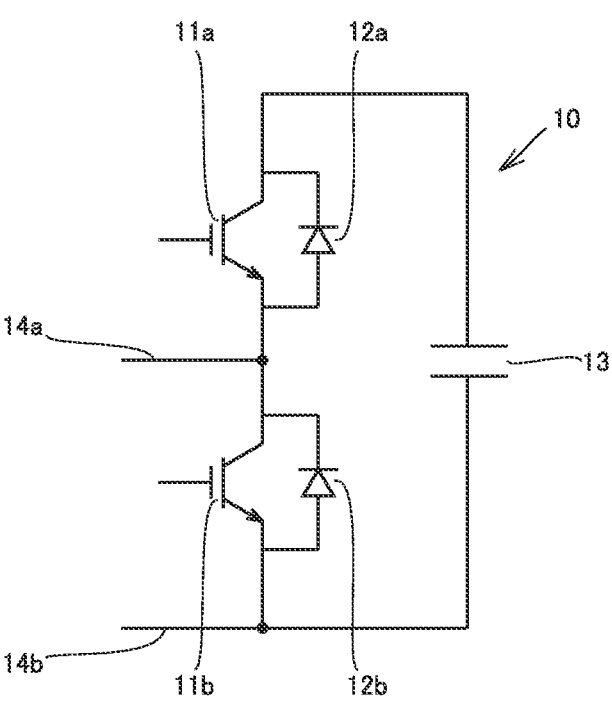
FIG. 2 is a schematic circuit diagram of a submodule 10.

FIG. 2 is a schematic circuit diagram of a submodule 10. As illustrated in FIG. 2, the submodule 10 includes, for example, a switching element 11a and a switching element 11b, a diode 12a and a diode 12b, a capacitor 13, a connection line 14a and a connection line 14b.

Each of the switching elements 11a and 11b is, for example, an IGBT (Insulated Gate Bipolar Transistor). The switching element 11a and the switching element 11b are connected to each other in series.

The diode 12a is connected in parallel to the switching element 11a in a reverse bias manner, and the diode 12b is connected in parallel to the switching element 11b in a reverse bias manner. The capacitor 13 is connected in parallel to the switching element 11a and the switching element 11b which are connected to each other in series.

The connection line 14a is connected to an emitter of the switching element 11a and a collector of the switching element 11b. The connection line 14b is connected to an emitter of the switching element 11b. The connection line 14a of one submodule 10 is connected to the connection line 14b of another adjacent submodule 10. Thus, the submodule 10 constitutes a half-bridge type converter cell.

Figure 3:
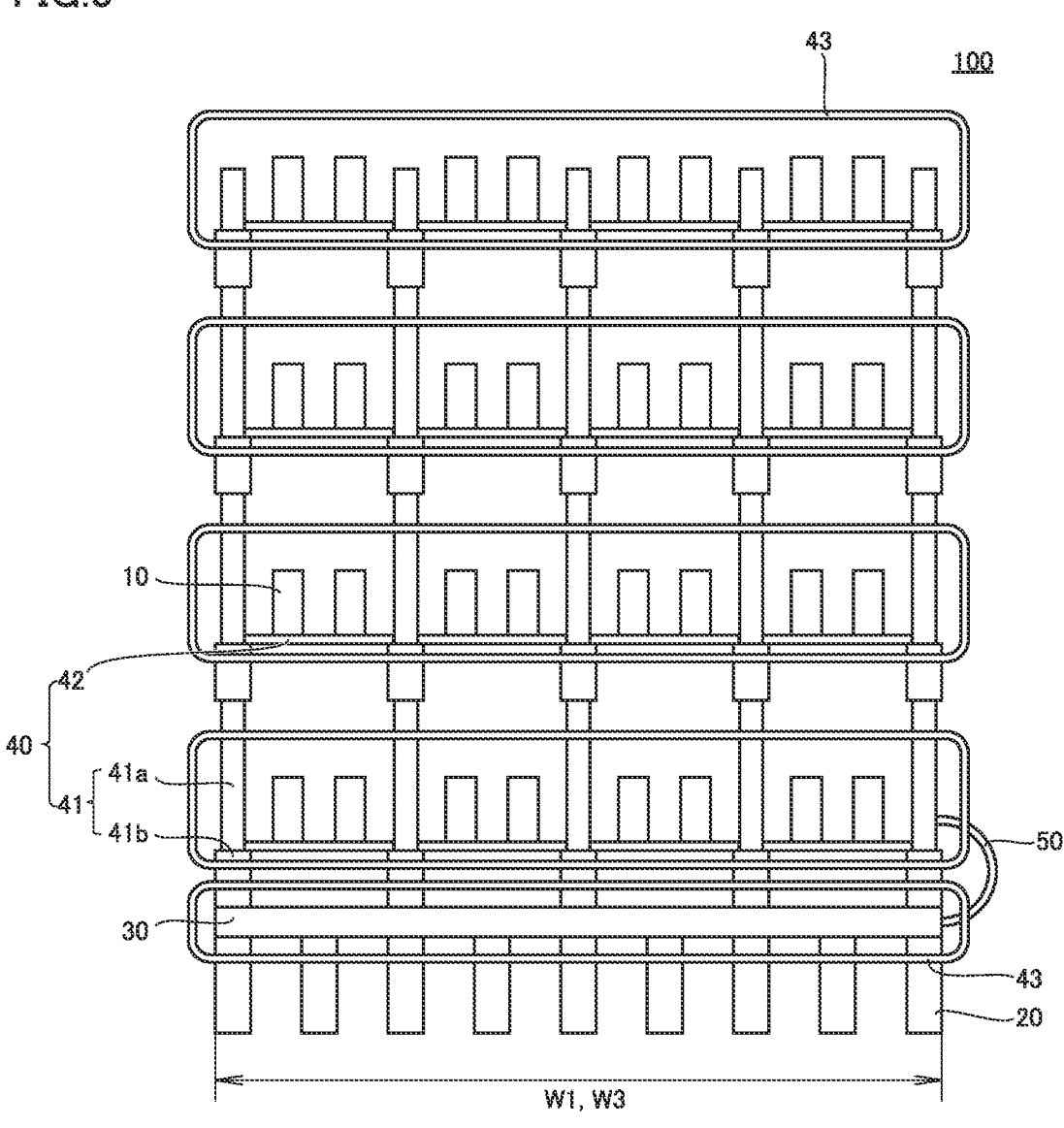
FIG. 3 is a front view of the power converter 100.
Figure 4:
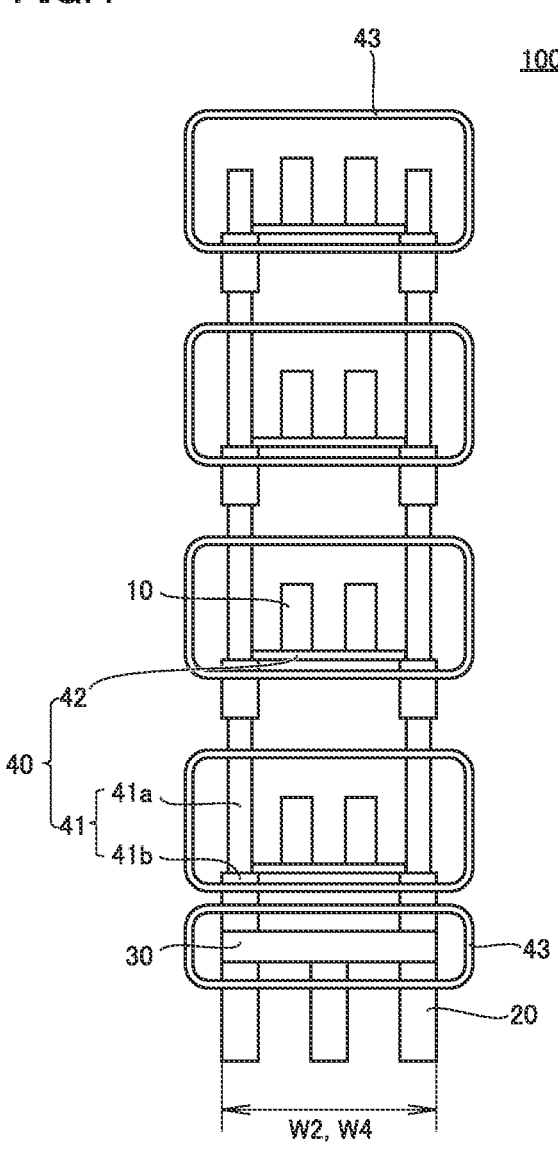
FIG. 4 is a side view of the power converter 100.

FIG. 3 is a front view of the power converter 100. FIG. 4 is a side view of the power converter 100. As illustrated in FIGS. 3 and 4, the power converter 100 includes a plurality of insulators 20, a metal base 30, an insulating frame 40, and a conductive member 50.

The insulator 20 is formed of an insulating material. The insulating material is, for example, FRP (Fiber Reinforced Plastic). The insulator 20 may have a fold formed of a polymer material on its surface. The number of the plurality of insulators 20 is larger than the number of a plurality of support columns 41 (which will be described below). The outer diameter of the insulator 20 is equal to, for example, the outer diameter of an insulator 41*b* (which will be described below).

The metal base 30 is formed of a metal material. The metal base 30 is disposed on the plurality of insulators 20. The metal base 30 has a width W1 and a width W2. The width W1 is the width of the metal base 30 in the longitudinal direction. The width W2 is the width of the metal base 30 in a direction orthogonal to the longitudinal direction.

The insulating frame 40 includes a plurality of support columns 41 and an insulating plate 42. The support column 41 extends in the vertical direction. The support column 41 includes a plurality of metal columns 41*a* and a plurality of insulators 41*b*. The metal column 41*a* extends in the vertical direction. The plurality of metal columns 41*a* are arranged along the vertical direction. The insulator 41*b* is disposed between two adjacent metal columns 41*a*. The support column 41 is disposed on the metal base 30 with the insulator 41*b* interposed therebetween. In other words, the insulator 41*b* is disposed on the end of the support column 41 closer to the metal base 30. Thereby, the insulation of the insulating frame 40 with respect to the metal base 30 is ensured. The insulator 41*b* is formed of an insulating material. For example, the insulator 41*b* is formed of the same material as the insulator 20.

The insulating plate 42 is formed of an insulating material. For example, the insulating plate 42 is formed of a ceramic material. The insulating plate 42 is supported by the support columns 41. When the insulating plate 42 is supported by the support columns 41, the main surface thereof extends in the vertical direction. A plurality of insulating plates 42 are disposed in a plurality of stages in the vertical direction. A plurality of insulating plates 42 are disposed on the same stage. The submodules 10 are disposed on each of the plurality of insulating plates 42. An electric field shield 43 is provided on the insulating frame 40 for each stage of the insulating plates 42. The electric field shield 43 may also be provided on the metal from 30. Thereby, the discharging from the insulating frame 40 and the metal base 30 is prevented.

The insulating frame 40 has a width W3 and a width W4. The width W3 is the width of the insulating frame 40 in the longitudinal direction. The width W4 is the width of the insulating frame 40 in a direction orthogonal to the longitudinal direction. In the power converter 100, the width W3 is equal to the width W1, and the width W4 is equal to the width W2. The insulating frame 40 is disposed in such a manner that the longitudinal direction of the insulating frame 40 is the same as the longitudinal direction of the metal base 30.

The conductive member 50 electrically connects one of the metal columns 41*a* of the support columns 41 to the metal base 30. More specifically, the conductive member 50 electrically connects the metal column 41*a* closest to the metal base 30 to the metal base 30.

Effect of Power Converter 100

The effect of the power converter 100 will be described below in comparison with a power converter according to a comparative example (hereinafter referred to as "power converter 200").

Figure 5:
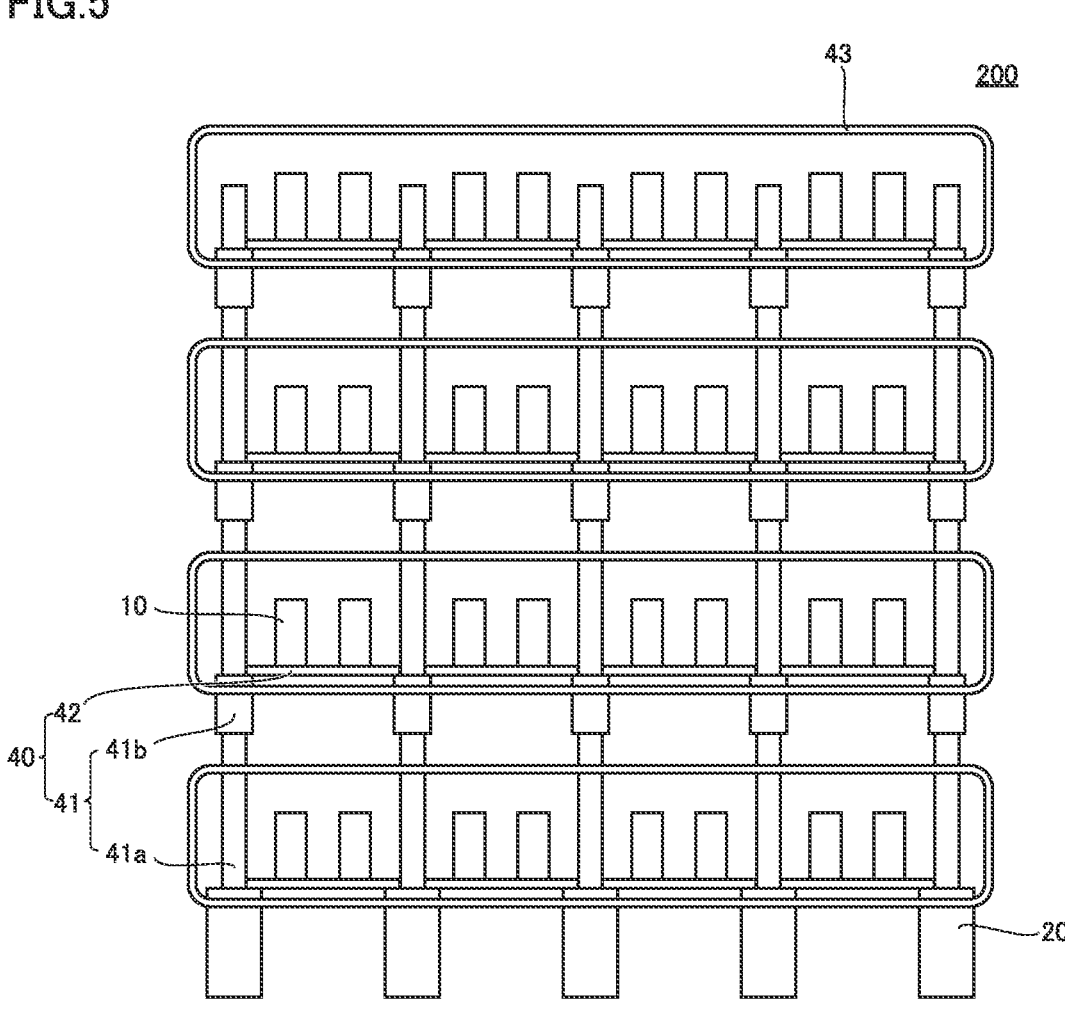
FIG. 5 is a front view of a power converter 200.

FIG. 5 is a front view of the power converter 200. As illustrated in FIG. 5, the power converter 200 includes a plurality of submodules 10, a plurality of insulators 20, and an insulating frame 40. In this respect, the configuration of the power converter 200 is the same as the configuration of the power converter 100.

The power converter 200 does not include a metal base 30. In the power converter 200, each of the plurality of support columns 41 is attached to each of the plurality of insulators 20. In the power converter 200, the outer diameter of the insulator 20 is larger than the outer diameter of the insulator 41*b*. In these respects, the configuration of the power converter 200 is different from the configuration of the power converter 100.

In the power converter 200, since each of the plurality of support columns 41 is attached to each of the plurality of insulators 20, the number and the arrangement of the plurality of insulators 20 are restricted by the number and the arrangement of the plurality of support columns 41. On the other hand, in the power converter 100, since the metal base 30 is interposed between the plurality of support columns 41 and the plurality of insulators 20, the number and the arrangement of the plurality of insulators 20 are not restricted by the number and the arrangement of the plurality of support columns 41.

In the power converter 200, since the number of the plurality of insulators 20 is restricted by the number of the plurality of support columns 41, in order to ensure the vibration-resistant performance, it is necessary to increase the outer diameter of each of the plurality of insulators 20. As a result, the installation area of the power converter 200 becomes large. In addition, since the cost of the insulator 20 with a large outer diameter is high, the manufacturing cost of the power converter 200 increases in order to ensure the vibration-resistant performance.

On the contrary, in the power converter 100, since the number and the arrangement of the plurality of insulators 20 are not restricted by the number and the arrangement of the plurality of support columns 41, it is possible to improve the vibration-resistant performance of the power converter 100 without increasing the outer diameter of the insulator 20, for example, by increasing the number of the plurality of insulators 20 or by optimizing the arrangement of the plurality of insulators 20. As described above, according to the power converter 100, it is possible to suppress an increase in the installation area and an increase in the manufacturing cost in order to ensure the vibration-resistant performance.

Second Embodiment

A power converter according to a second embodiment (hereinafter referred to as "power converter 100A") will be described. In the present embodiment, those components different from the power converter 100 will be mainly described, and the description will not be repeated for the same or corresponding components.

Configuration of Power Converter 100A

Hereinafter, the configuration of the power converter 100A will be described.

Figure 6:
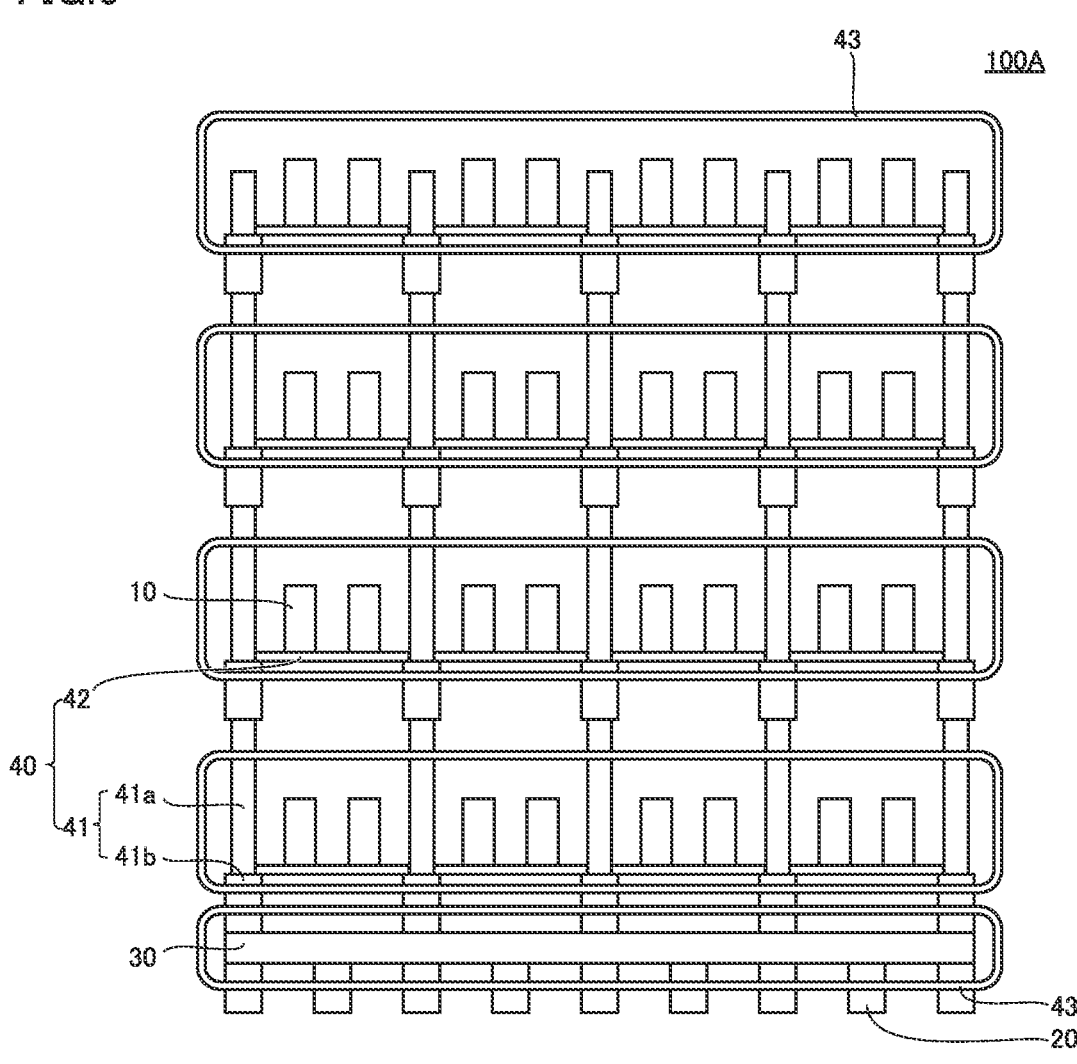
FIG. 6 is a front view of a power converter 100A.

FIG. 6 is a front view of the power converter 100A. As illustrated in FIG. 6, the power converter 100A includes a plurality of submodules 10, a plurality of insulators 20, a metal base 30 disposed on the plurality of insulators 20, and an insulating frame 40 disposed on the metal base 30. In this respect, the configuration of the power converter 100A is the same as the configuration of the power converter 100.

However, the power converter 100A does not include the conductive member 50. In other words, in the power converter 100A, the metal base 30 is at a floating potential. In this respect, the configuration of the power converter 100A is different from the configuration of the power converter 100.

Effect of Power Converter 100A

Hereinafter, the effect of the power converter 100A will be described.

In the power converter 100, since the metal base 30 is electrically connected to the metal column 41a closest to the metal base 30, the ground insulation distance is determined by the distance between the metal base 30 and the installation surface of the power converter 100. Therefore, in the power converter 100, it is necessary to increase the length of the insulator 20 in order to ensure the ground insulation distance. On the contrary, in the power converter 100A, since the metal base 30 is at a floating potential, the ground insulation distance is determined by the distance between the insulating plate 42 closest to the metal base 30 and the installation surface of the power converter 100A. Therefore, in the power converter 100A, even if the length of the insulator 20 is shorter than that of the power converter 100, it is possible to ensure the ground insulation distance. As a result, the power converter 100A can be made lower in height than the power conversion device 100.

Third Embodiment

A power converter according to a third embodiment (hereinafter referred to as "power converter 100B") will be described. In the present embodiment, those components different from the power converter 100 will be mainly described, and the description will not be repeated for the same or corresponding components.

Configuration of Power Converter 100B

Hereinafter, the configuration of the power converter 100B will be described.

Figure 7:
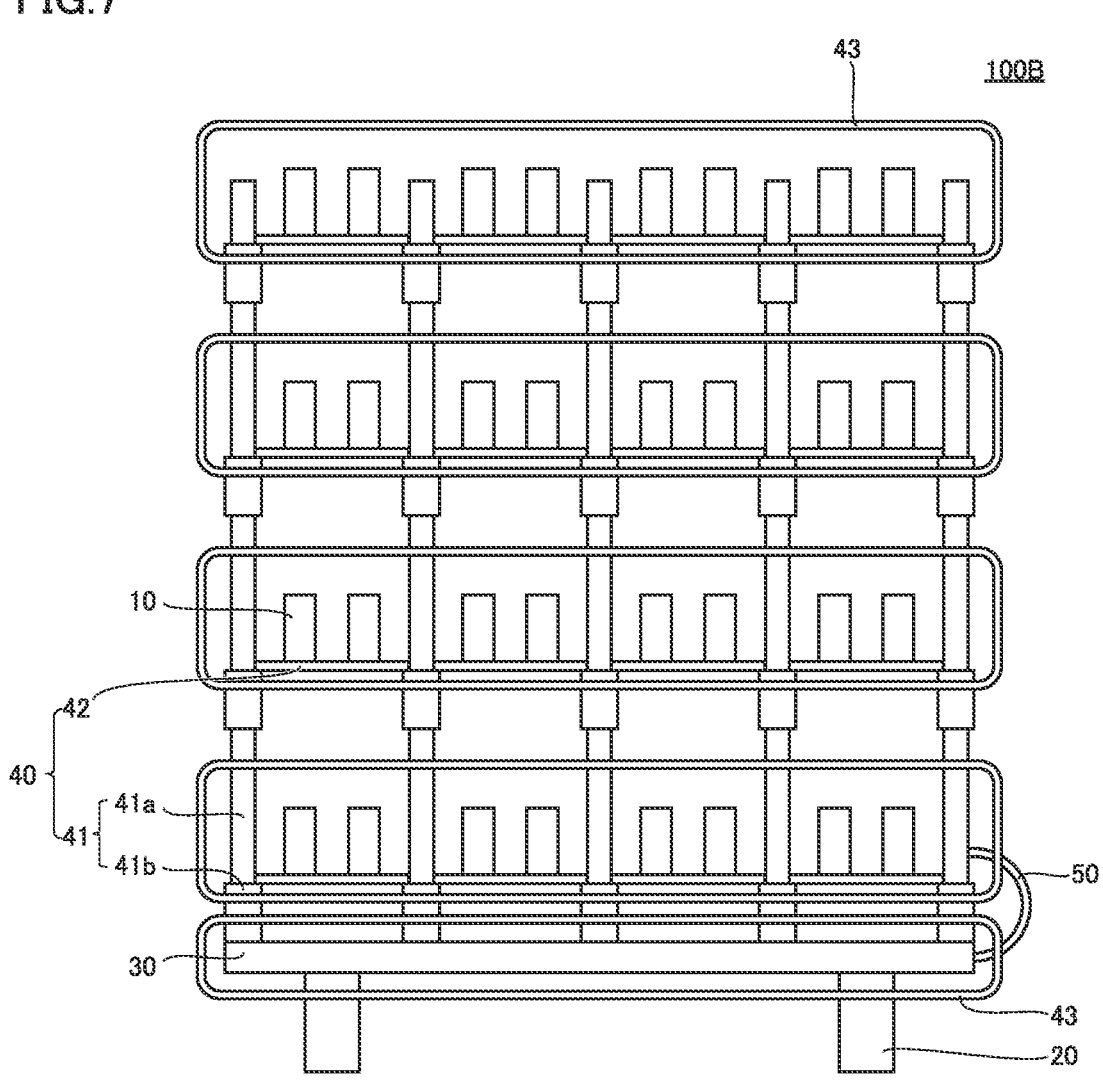
FIG. 7 is a front view of a power converter 100B.

FIG. 7 is a front view of the power converter 100B. As illustrated in FIG. 7, the power converter 100B includes a plurality of submodules 10, a plurality of insulators 20, a metal base 30 disposed on the plurality of insulators 20, an insulating frame 40 disposed on the metal base 30, and a conductive member 50. In this respect, the configuration of the power converter 100B is the same as the configuration of the power converter 100.

However, in the power converter 100B, the number of the plurality of insulators 20 is smaller than the number of the plurality of support columns 41. Moreover, in the power converter 100B, the outer diameter of the insulator 20 is larger than the outer diameter of the insulator 41b. In these respects, the configuration of the power converter 100B is different from the configuration of the power converter 100.

Effect of Power Converter 100B

Hereinafter, the effect of the power converter 100B will be described.

In the power converter 100B, although the number of the plurality of insulators 20 is smaller than the number of the plurality of support columns 41, since the outer diameter of the insulator 20 is larger than the outer diameter of the insulator 41b, it is possible to maintain the vibration-resistant performance. Moreover, in the power converter 100B, since the number of the plurality of insulators 20 is smaller than the number of the plurality of support columns 41, it is possible to reduce the installation area as compared with the power converter 100.

Fourth Embodiment

A power converter according to a fourth embodiment (hereinafter referred to as "power converter 100C") will be described. In the present embodiment, those components different from the power converter 100A will be mainly described, and the description will not be repeated for the same or corresponding components.

Configuration of Power Converter 100C

Hereinafter, the configuration of the power converter 100C will be described.

Figure 8:
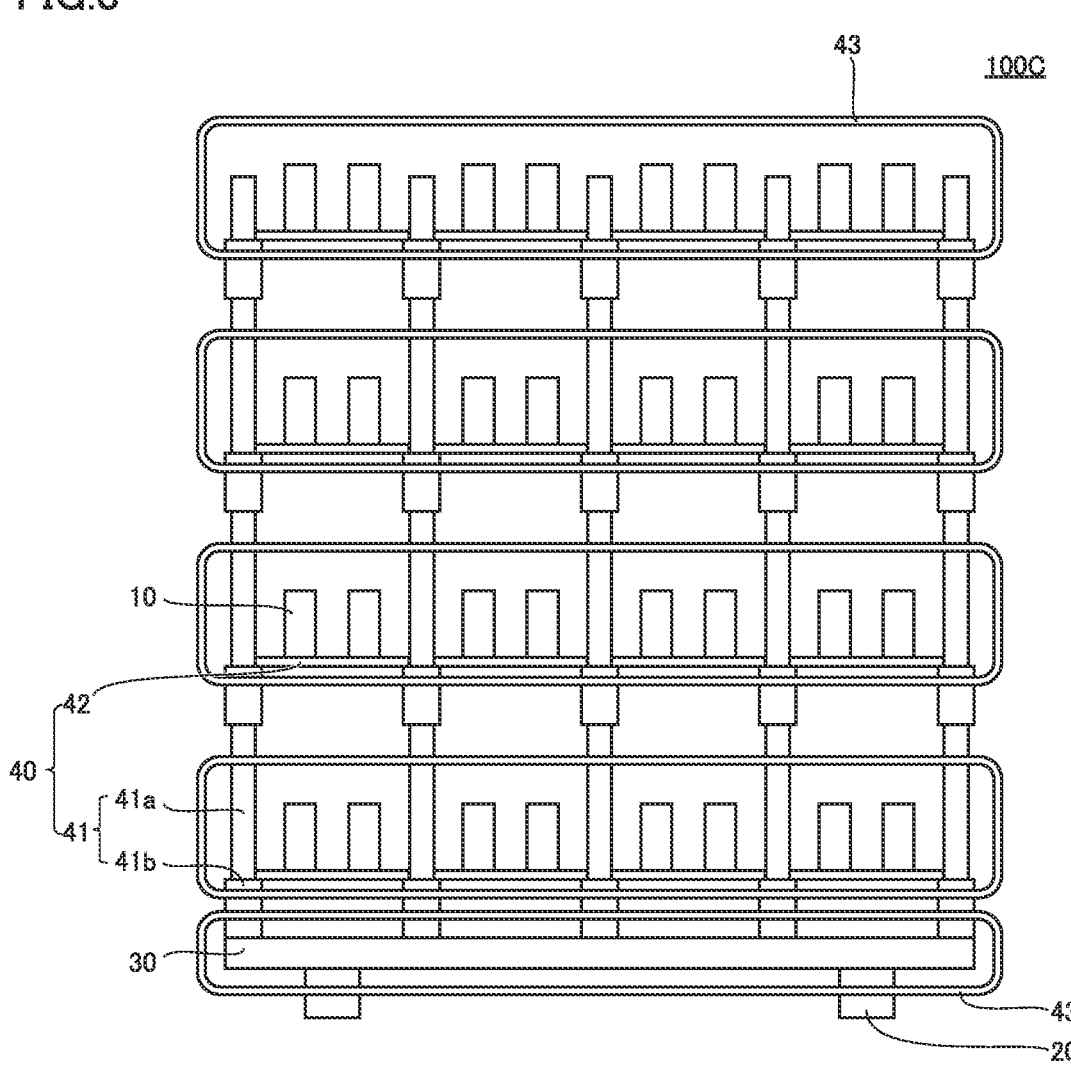
FIG. 8 is a front view of a power converter 100C.

FIG. 8 is a front view of the power converter 100C. As illustrated in FIG. 8, the power converter 100C includes a plurality of submodules 10, a plurality of insulators 20, a metal base 30 disposed on the plurality of insulators 20, and an insulating frame 40 disposed on the metal base 30. In this respect, the configuration of the power converter 100C is the same as the configuration of the power converter 100A.

However, in the power converter 100C, the number of the plurality of insulators 20 is smaller than the number of the plurality of support columns 41. Moreover, in the power converter 100C, the outer diameter of the insulator 20 is larger than the outer diameter of the insulator 41b. In these respects, the configuration of the power converter 100C is different from the configuration of the power converter 100A.

Effect of Power Converter 100C

Hereinafter, the effect of the power converter 100C will be described.

In the power converter 100C, although the number of the plurality of insulators 20 is smaller than the number of the plurality of support columns 41, since the outer diameter of the insulator 20 is larger than the outer diameter of the insulator 41b, it is possible to maintain the vibration-resistant performance. Moreover, in the power converter 100C, since the number of the plurality of insulators 20 is smaller than the number of the plurality of support columns 41, it is possible to reduce the installation area as compared with the power converter 100A.

Fifth Embodiment

A power converter according to a fifth embodiment (hereinafter referred to as "power converter 100D") will be described. In the present embodiment, those components different from the power converter 100 will be mainly described, and the description will not be repeated for the same or corresponding components.

Configuration of Power Converter 100D

Hereinafter, the configuration of the power converter 100D will be described.

Figure 9:
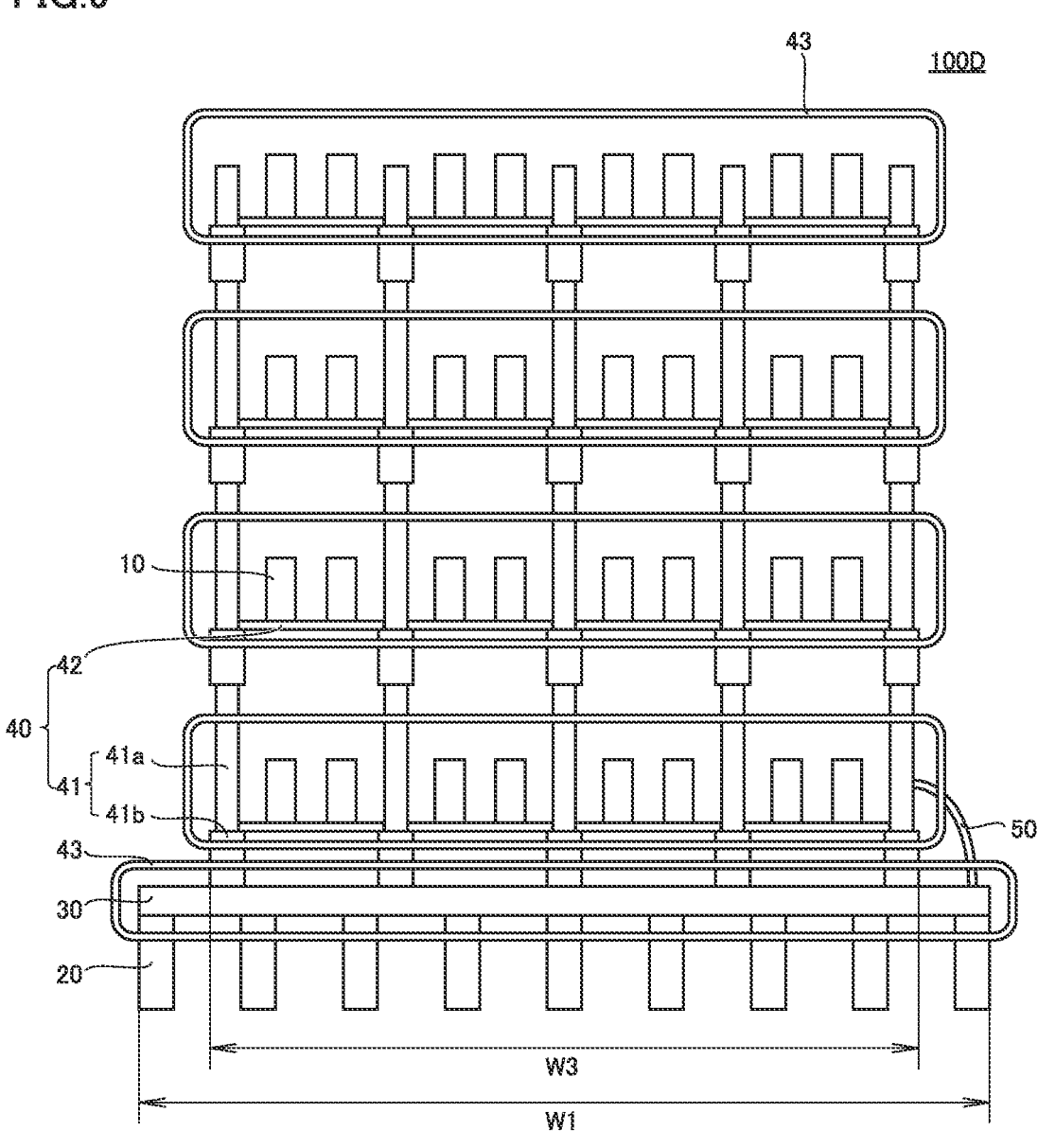
FIG. 9 is a front view of a power converter 100D.

FIG. 9 is a front view of the power converter 100D. As illustrated in FIG. 9, the power converter 100D includes a plurality of submodules 10, a plurality of insulators 20, a metal base 30 disposed on the plurality of insulators 20, an insulating frame 40 disposed on the metal base 30, and a conductive member 50. In this respect, the configuration of the power converter 100D is the same as the configuration of the power converter 100.

However, in the power converter 100D, the width of the metal base 30 in the longitudinal direction (width W1) is larger than the width of the insulating frame 40 in the longitudinal direction (width W3). In this respect, the configuration of the power converter 100D is different from the configuration of the power converter 100.

Effect of Power Converter 100D

Hereinafter, the effect of the power converter 100D will be described.

In the power converter 100D, since the width W1 is larger than the width W3, it is possible to increase the number of the plurality of insulators 20 as compared with the power converter 100. Moreover, in the power converter 100D, since the width W1 is larger than the width W3, the degree of freedom of arranging the plurality of insulators 20 is increased, which makes it possible to easily optimize the arrangement of the plurality of insulators 20. As a result, it is possible to further improve the vibration-resistant performance of the power converter 100D.

Sixth Embodiment

A power converter according to a sixth embodiment (hereinafter referred to as "power converter 100E") will be described. In the present embodiment, those components different from the power converter 100A will be mainly described, and the description will not be repeated for the same or corresponding components.

Configuration of Power Converter 100E

Hereinafter, the configuration of the power converter 100E will be described.

Figure 10:
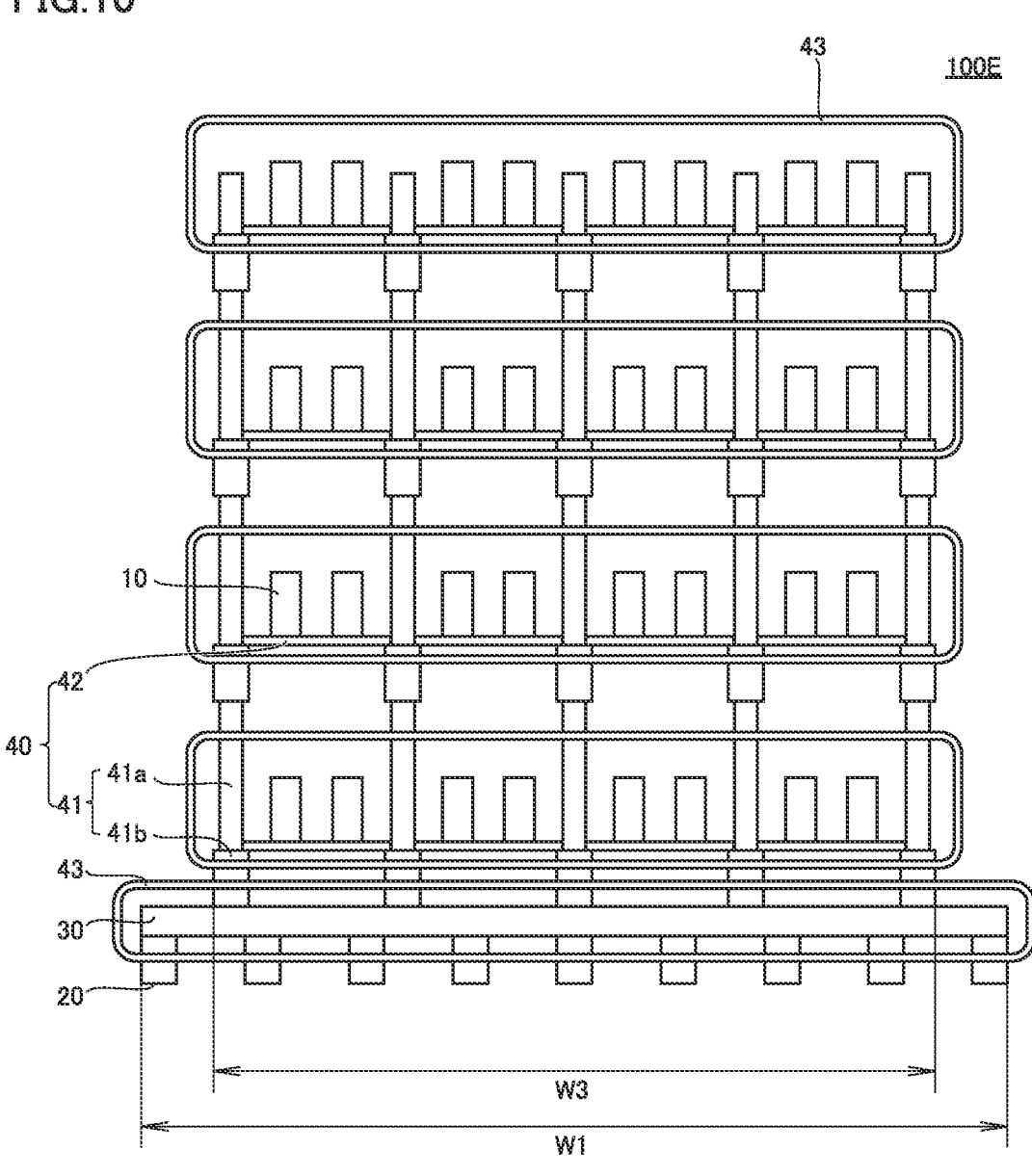
FIG. 10 is a front view of a power converter 100E.

FIG. 10 is a front view of the power converter 100E. As illustrated in FIG. 10, the power converter 100E includes a plurality of submodules 10, a plurality of insulators 20, a metal base 30 disposed on the plurality of insulators 20, and an insulating frame 40 disposed on the metal base 30. In this respect, the configuration of the power converter 100E is the same as the configuration of the power converter 100A.

However, in the power converter 100E, the width of the metal base 30 in the longitudinal direction (width W1) is larger than the width of the insulating frame 40 in the longitudinal direction (width W3). In this respect, the configuration of the power converter 100E is different from the configuration of the power converter 100A.

Effect of Power Converter 100E

Hereinafter, the effect of the power converter 100E will be described.

In the power converter 100E, since the width W1 is larger than the width W3, it is possible to increase the number of the plurality of insulators 20 as compared with the power converter 100A. Moreover, in the power converter 100E, since the width W1 is larger than the width W3, the degree of freedom of arranging the plurality of insulators 20 is increased, which makes it possible to easily optimize the arrangement of the plurality of insulators 20. As a result, it is possible to further improve the vibration-resistant performance of the power converter 100E.

Seventh Embodiment

A power converter according to a seventh embodiment (hereinafter referred to as "power converter 100F") will be described. In the present embodiment, those components different from the power converter 100 will be mainly described, and the description will not be repeated for the same or corresponding components.

Configuration of Power Converter 100F

Hereinafter, the configuration of the power converter 100F will be described.

Figure 11:
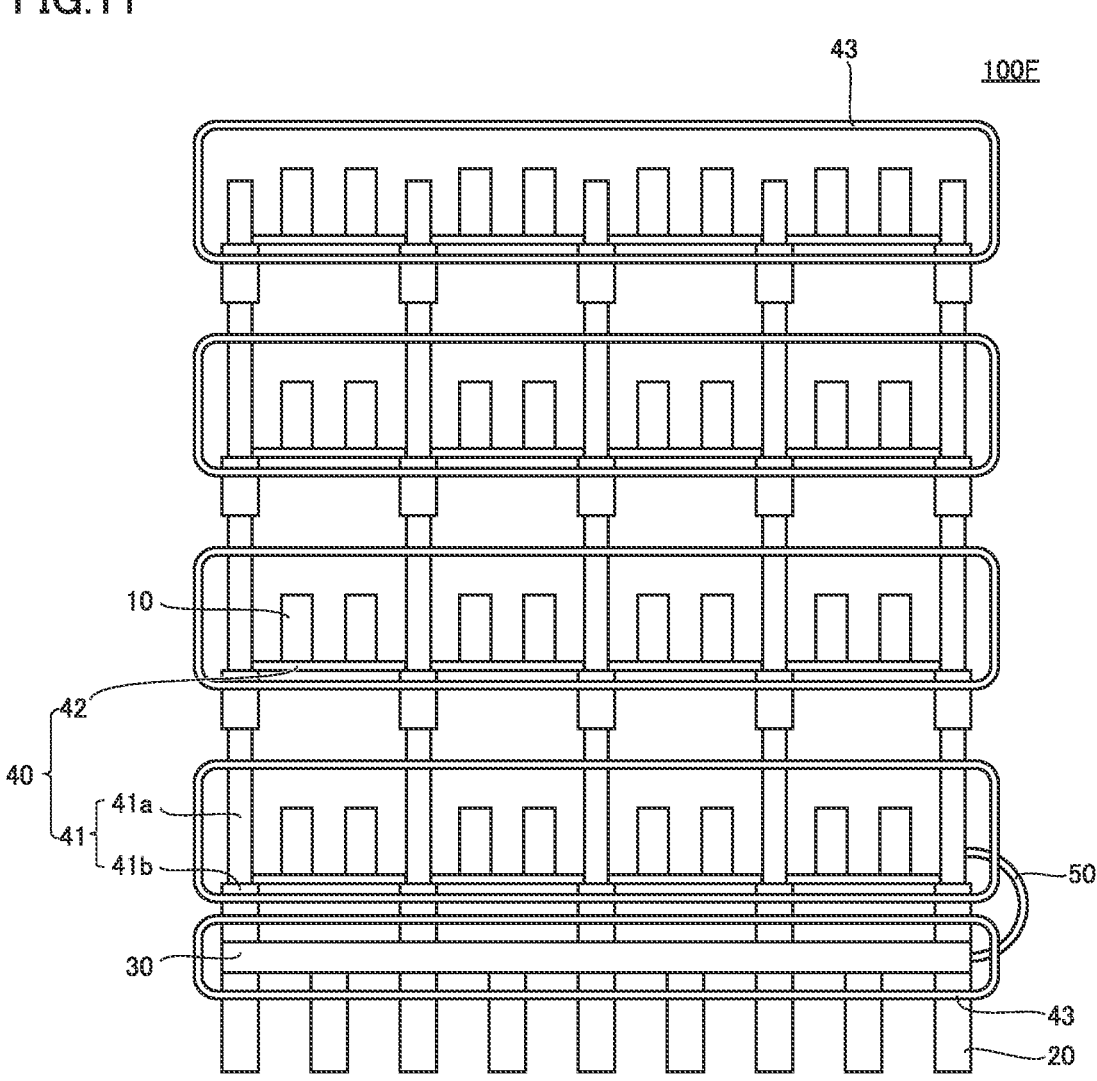
FIG. 11 is a front view of a power converter 100F.
Figure 12:
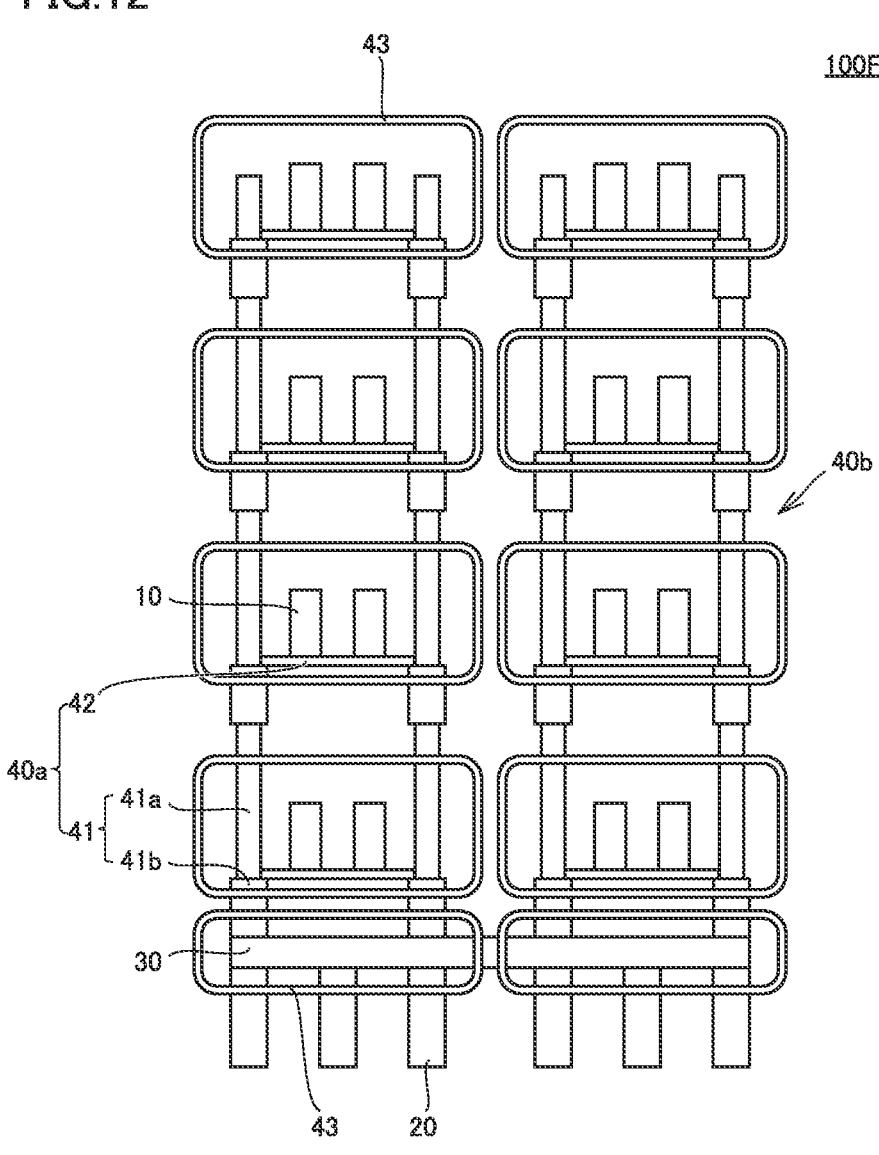
FIG. 12 is a side view of the power converter 100F.

FIG. 11 is a front view of the power converter 100F. FIG. 12 is a side view of the power converter 100F. As illustrated in FIGS. 11 and 12, the power converter 100F includes a plurality of submodules 10, a plurality of insulators 20, a metal base 30 disposed on the plurality of insulators 20, an insulating frame 40 disposed on the metal base 30, and a conductive member 50. In this respect, the configuration of the power converter 100F is the same as the configuration of the power converter 100.

However, the power converter 100F includes a plurality of insulating frames 40. In this respect, the configuration of the power converter 100F is different from the configuration of the power converter 100. In the example illustrated in FIGS. 11 and 12, the number of the plurality of insulating frames 40 is two (hereinafter, referred to as an "insulating frame 40a" and an "insulating frame 40b", respectively), but the number of the plurality of insulating frames 40 is not limited to two.

The insulating frame 40a and the insulating frame 40b have, for example, the same structure. The insulating frame 40a and the insulating frame 40b are disposed in such a manner that the longitudinal direction of the insulating frame 40a and the longitudinal direction of the insulating frame 40b are parallel to each other. The plurality of submodules 10 installed on the insulating frame 40a and the plurality of submodules 10 installed on the insulating frame 40b are electrically connected to each other.

Figure 13:
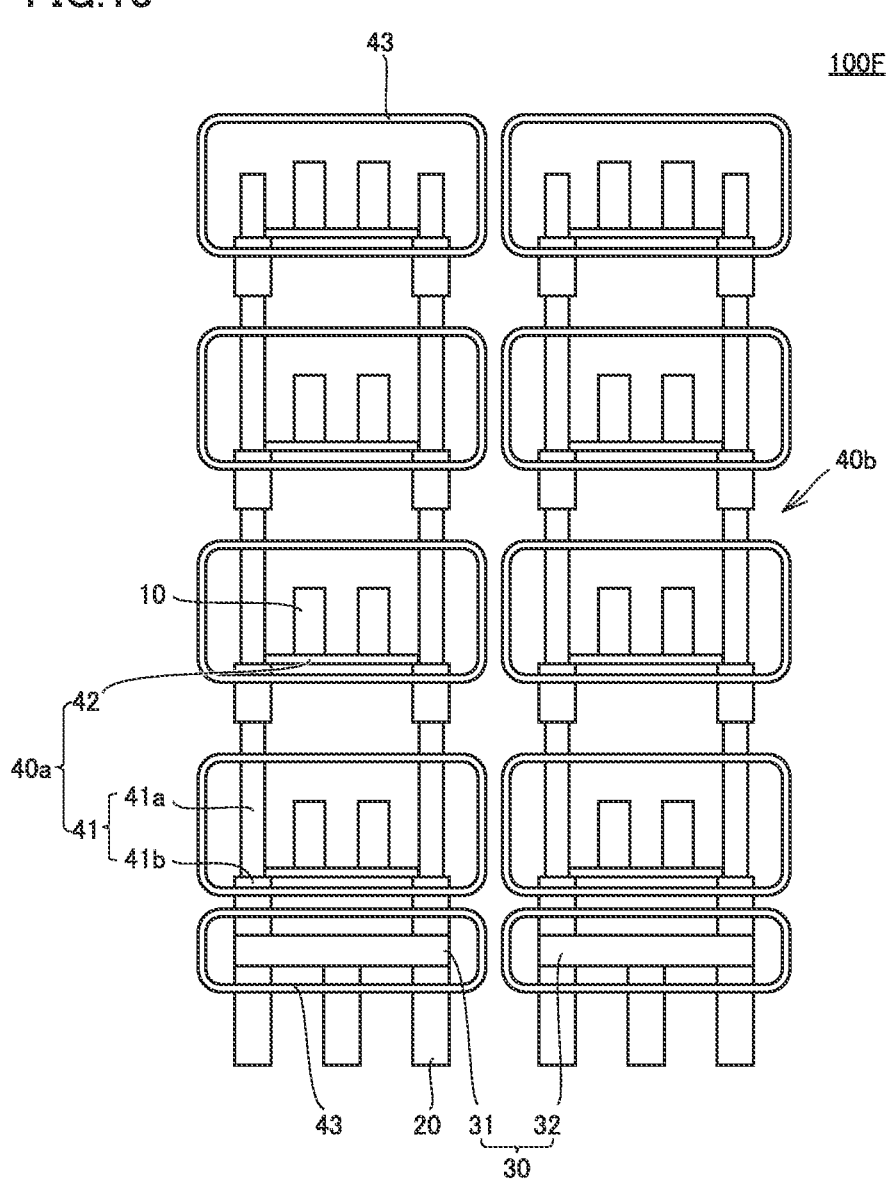
FIG. 13 is a side view of a power converter 100F according to a modification.

FIG. 13 is a side view of a power converter 100F according to a modification. As illustrated in FIG. 13, in the power converter 100F, the metal base 30 may be divided into a first member 31 and a second member 32. For example, the first member 31 and the second member 32 are separated from each other in a direction orthogonal to the longitudinal direction of the metal base 30. The insulating frame 40a is disposed on the first member 31, and the insulating frame 40b is disposed on the second member 32.

Effect of Power Converter 100F

Hereinafter, the effect of the power converter 100F will be described.

The plurality of submodules 10 installed on the insulating frame 40a and the plurality of submodules 10 installed on the insulating frame 40b have different potentials. When the metal base 30 is divided into the first member 31 and the second member 32, it is possible to optimize the insulation for the plurality of submodules 10 installed on the insulating frame 40a and the insulation for the plurality of submodules 10 installed on the insulating frame 40b, respectively. On the other hand, when the metal base 30 is not divided into the first member 31 and the second member 32, it is easy to ensure the vibration-resistant performance.

Eighth Embodiment

A power converter according to an eighth embodiment (hereinafter referred to as "power converter 100G") will be described. In the present embodiment, those components different from the power converter 100 will be mainly described, and the description will not be repeated for the same or corresponding components.

Configuration of Power Converter 100G

Hereinafter, the configuration of the power converter 100G will be described.

Figure 14:
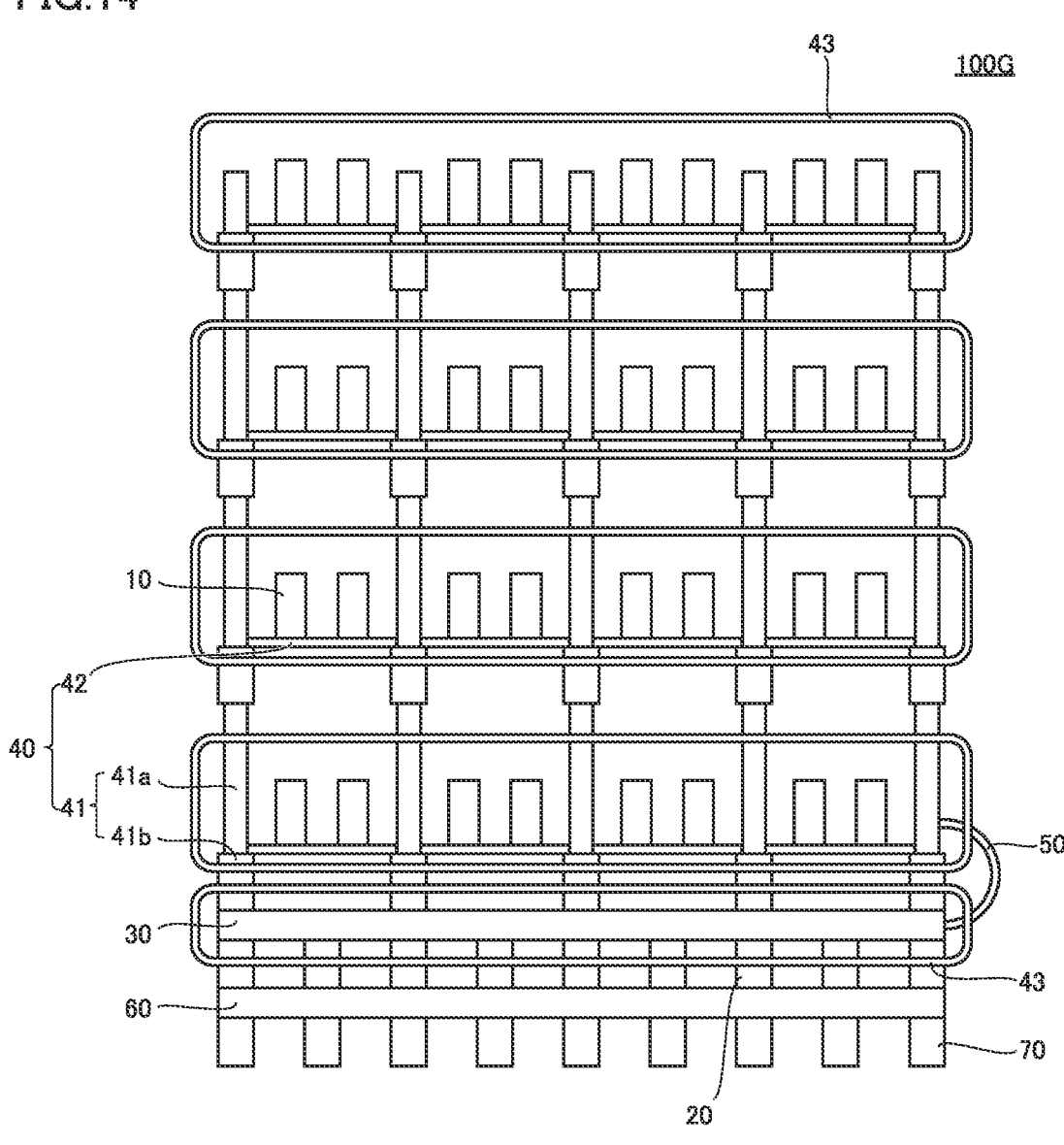
FIG. 14 is a front view of a power converter 100G.

FIG. 14 is a front view of the power converter 100G. As illustrated in FIG. 14, the power converter 100G includes a plurality of submodules 10, a plurality of insulators 20, a metal base 30 disposed on the plurality of insulators 20, an insulating frame 40 disposed on the metal base 30, and a conductive member 50. In this respect, the configuration of the power converter 100G is the same as the configuration of the power converter 100.

However, the power converter 100G includes a metal base 60 and a plurality of insulators 70. The metal base 60 is disposed on the plurality of insulators 70. The plurality of insulators 20 are disposed on the metal base 60. In these respects, the configuration of the power converter 100G is different from the configuration of the power converter 100.
Effect of Power Converter 100G

Hereinafter, the effect of the power converter 100G will be described.

In the power converter 100G, the metal base 60 and the plurality of insulators 70 are disposed between the plurality of insulators 20 and the installation surface. Therefore, if the distance between the metal base 30 and the installation surface is the same as that of the power converter 100, the length of the insulator 20 and the length of the insulator 70 in the power converter 100G are smaller than the length of the insulator 20 in the power converter 100. Since the insulator 20 and the insulator 70 are shortened, the vibration-resistant performance of the power converter 100G is improved.

Ninth Embodiment

A power converter according to a ninth embodiment (hereinafter referred to as "power converter 100H") will be described. In the present embodiment, those components different from the power converter 100 will be mainly described, and the description will not be repeated for the same or corresponding components.
Configuration of Power Converter 100H

Hereinafter, the configuration of the power converter 100H will be described.

Figure 15:
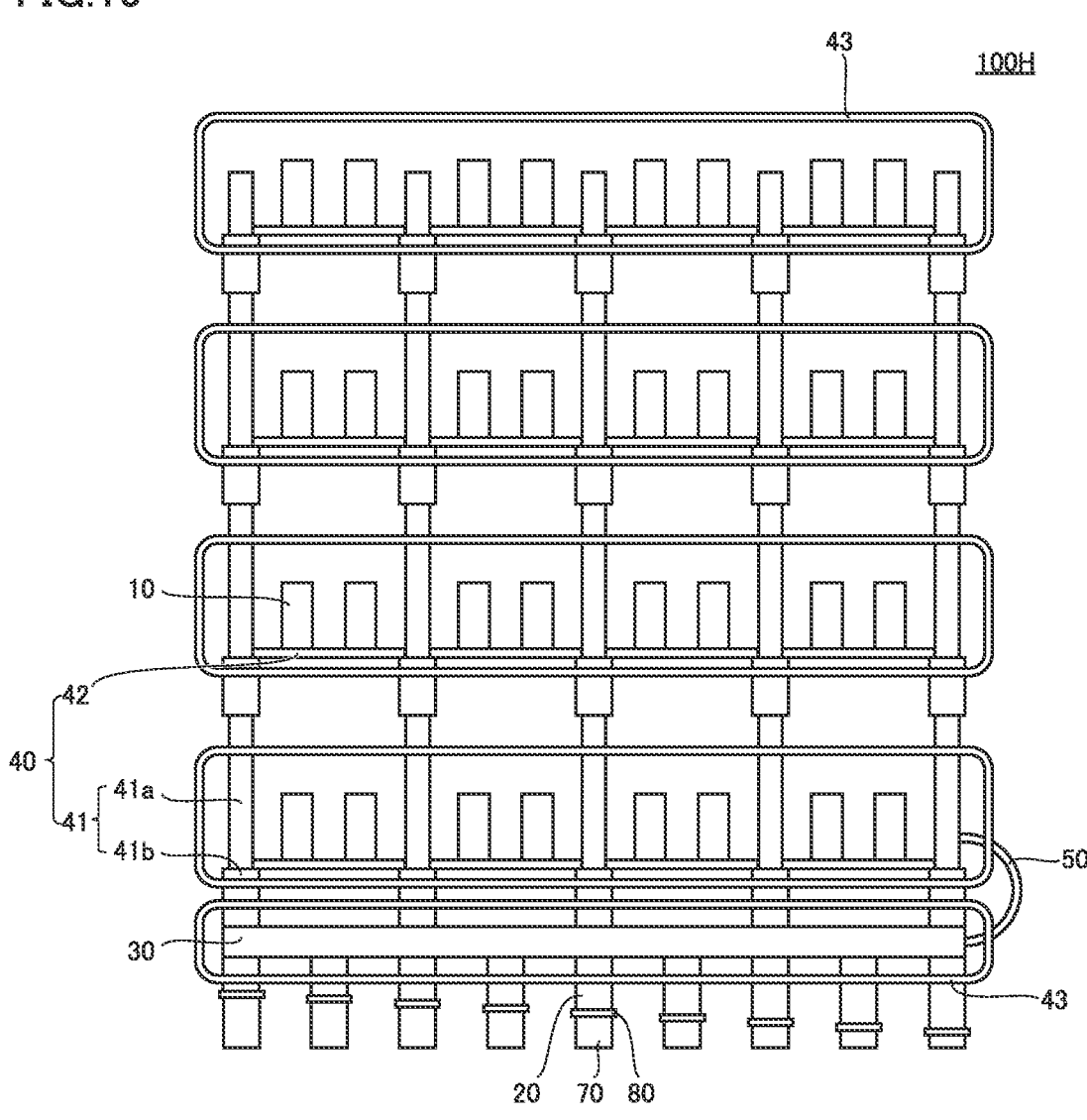
FIG. 15 is a front view of a power converter 100H.

FIG. 15 is a front view of the power converter 100H. As illustrated in FIG. 15, the power converter 100H includes a plurality of submodules 10, a plurality of insulators 20, a metal base 30 disposed on the plurality of insulators 20, an insulating frame 40 disposed on the metal base 30, and a conductive member 50. In this respect, the configuration of the power converter 100H is the same as the configuration of the power converter 100.

However, the power converter 100H further includes a plurality of insulators 70 and a plurality of metal plates 80. In the power converter 100H, each of the plurality of metal plates 80 are disposed between one of the plurality of insulators 20 and one of the plurality of insulators 70. The lengths of the plurality of insulators 20 are different from each other. In other words, the positions of the plurality of metal plates 80 in the vertical direction are different from each other. In these respects, the configuration of the power converter 100H is different from the configuration of the power converter 100.
Effect of Power Converter 100H

Hereinafter, the effect of the power converter 100H will be described.

In the power converter 100H, the plurality of insulators 70 and the plurality of metal plates 80 are disposed between the plurality of insulators 20 and the installation surface. Therefore, if the distance between the metal base 30 and the installation surface is the same as that of the power converter 100, the length of the insulator 20 of the power converter 100H and the length of the insulator 70 are smaller than the length of the insulator 20 of the power converter 100. Since the insulator 20 and the insulator 70 are shortened, the vibration-resistant performance of the power converter 100H is improved.

The potentials of the plurality of submodules 10 installed on the insulating frame 40 are different for each position. In the power converter 100H, since the positions of the plurality of metal plates 80 in the vertical direction are different from each other, it is possible to optimize the insulation of the plurality of submodules 10 installed on the insulation base 40 for each position.

It should be understood that the embodiments disclosed herein are illustrative and non-restrictive in all respects. The scope of the present invention is defined by the terms of the claims rather than the description of the embodiments above, and is intended to include any modifications within the scope and meaning equivalent to the terms of the claims.

REFERENCE SIGNS LIST

10: submodule: 11a, 11b: switching element: 12a, 12b: diode: 13: capacitor: 14a, 14b: connection line: 20: insulator; 30: metal base: 31: first member: 32: second member: 40, 40a, 40b: insulating frame: 41: support column: 41a: metal column: 41b: insulator: 42: insulating plate: 43: electric field shield; 50: conductive member; 60: metal base; 70: insulator: 80: metal plate: 100, 100A, 100B, 100C, 100D, 100E, 100F, 100G, 100H, 200: power converter: 110: upper arm: 120: lower arm; 130: transformer; W1, W2, W3, W4: width

The invention claimed is:

1. A power converter comprising:
a plurality of first insulators;
a first metal base disposed on the plurality of first insulators;
at least one insulating frame disposed on the first metal base; and
a plurality of submodules installed on the at least one insulating frame,
each of the at least one insulating frame including a plurality of support columns and a plurality of insulating plates which are supported by the plurality of support columns and on which the plurality of submodules are disposed,
each of the plurality of support columns including a plurality of metal columns and a plurality of second insulators, and being disposed on the first metal base with one of the plurality of second insulators interposed therebetween,
two adjacent metal columns among the plurality of metal columns being connected to each other by a corresponding one of the plurality of second insulators,
a plurality of third insulators; and
a second metal base disposed on the plurality of third insulators,
wherein the plurality of first insulators are disposed on the second metal base.

2. The power converter according to according to claim 1, further comprising:
a conductive member that electrically connects the first metal base and one of the plurality of metal columns.

3. The power converter according to claim 1, wherein the first metal base is at a floating potential.

4. The power converter according to claim 1, wherein the number of the plurality of first insulators is larger than the number of the plurality of support columns.

5. The power converter according to claim 1, wherein a width of the first metal base is larger than a width of the at least one insulating frame.

6. The power converter according to claim 1, wherein the number of the plurality of first insulators is smaller than the number of the plurality of support columns, and an outer diameter of each of the plurality of first insulators is larger than an outer diameter of each of the plurality of second insulators.

7. The power converter according to claim 1, wherein the at least one insulating frame includes a plurality of insulating frames arranged adjacent to each other.

8. The power converter according to claim 7, wherein the first metal base is divided into a plurality of members, and each of the plurality of insulating frames is disposed on a corresponding one of the plurality of members.

9. A power converter comprising:

a plurality of first insulators;

a first metal base disposed on the plurality of first insulators;

at least one insulating frame disposed on the first metal base;

a plurality of submodules installed on the at least one insulating frame, each of the at least one insulating frame including a plurality of support columns and a plurality of insulating plates which are supported by the plurality of support columns and on which the plurality of submodules are disposed, each of the plurality of support columns including a plurality of metal columns and a plurality of second insulators, and being disposed on the first metal base with one of the plurality of second insulators interposed therebetween, two adjacent metal columns among the plurality of metal columns being connected to each other by a corresponding one of the plurality of second insulators, the first metal base is at a floating potential, a plurality of metal plates; and a plurality of third insulators, wherein each of the plurality of metal plates is disposed between one of the plurality of first insulators and one of the plurality of third insulators.

10. The power converter according to claim 9, wherein the lengths of the plurality of first insulators are different from each other.

\* \* \* \* \*